United States Patent
Lee

(10) Patent No.: US 12,429,979 B2
(45) Date of Patent: Sep. 30, 2025

(54) HOW TO LAYOUT THE SIGNAL LINES ON THE UPPER LAYER OF THE CONDUCTOR

(71) Applicant: Sung Ho Lee, Seogwipo-si (KR)

(72) Inventor: Sung Ho Lee, Seogwipo-si (KR)

(73) Assignee: Sung Ho Lee, Seogwipo-si (KR)

( * ) Notice: Subject to any disclaimer, the term of this patent is extended or adjusted under 35 U.S.C. 154(b) by 0 days.

(21) Appl. No.: 18/528,781

(22) Filed: Dec. 5, 2023

(65) Prior Publication Data

US 2025/0181189 A1     Jun. 5, 2025

(51) Int. Cl.
| | |
|---|---|
| G06F 3/041 | (2006.01) |
| G06F 3/044 | (2006.01) |
| G09G 3/3208 | (2016.01) |
| G09G 3/36 | (2006.01) |
| H10K 59/40 | (2023.01) |

(52) U.S. Cl.
CPC .......... *G06F 3/0418* (2013.01); *G06F 3/0412* (2013.01); *G06F 3/0446* (2019.05); *G09G 3/3208* (2013.01); *G09G 3/36* (2013.01); *H10K 59/40* (2023.02)

(58) Field of Classification Search
CPC .... G06F 3/0412; G06F 3/0418; G06F 3/0446; G09G 3/3208; G09G 3/36; H10K 59/40
See application file for complete search history.

(56) References Cited

U.S. PATENT DOCUMENTS

| | | | | |
|---|---|---|---|---|
| 7,462,872 B2* | 12/2008 | Lee | ............. | G02F 1/134363 |
| | | | | 349/143 |
| 7,663,607 B2* | 2/2010 | Hotelling | ............. | G06F 3/04166 |
| | | | | 345/173 |
| 9,007,343 B1* | 4/2015 | Ludden | ............. | G06F 3/04184 |
| | | | | 345/173 |
| 9,459,718 B2* | 10/2016 | Ishizaki | ............. | G02F 1/13306 |
| 9,557,866 B2* | 1/2017 | Liu | ............. | G06F 3/0443 |
| 10,325,133 B2* | 6/2019 | Ghavanini | ............. | G06F 3/0416 |
| 10,521,049 B2* | 12/2019 | Schultz | ............. | G06F 3/0443 |
| 2002/0024626 A1* | 2/2002 | Lee | ............. | G02F 1/134363 |
| | | | | 349/143 |
| 2010/0214262 A1* | 8/2010 | Ishizaki | ............. | G02F 1/133528 |
| | | | | 345/174 |
| 2010/0328255 A1* | 12/2010 | Ishizaki | ............. | G06F 3/0412 |
| | | | | 345/174 |
| 2016/0320886 A1* | 11/2016 | Kim | ............. | G06F 3/047 |
| 2017/0205957 A1* | 7/2017 | Park | ............. | G06F 3/0443 |
| 2019/0339799 A1* | 11/2019 | Blondin | ............. | G06F 3/04166 |
| 2020/0104027 A1* | 4/2020 | Gourevitch | ............. | G06F 3/04164 |

FOREIGN PATENT DOCUMENTS

KR     10-1637422 B1     7/2016

* cited by examiner

*Primary Examiner* — Mihir K Rayan
(74) *Attorney, Agent, or Firm* — Nicholas Park

(57) ABSTRACT

The present invention relates to the CDA that constitutes the capacitive detection device of the present invention placed on the upper side of the conductor. It aims to narrow the width of the far-distance CDA signal line, which was previously widened to reduce resistance, to be the same as the width of the near-distance signal line. As a result, this reduces the time constant in the far-distance CDA, enhancing the detection speed, and minimizes the width of the Dead Zone caused by the signal line, thereby reducing object detection errors or touch coordinate calculation errors.

23 Claims, 9 Drawing Sheets

HOW TO LAYOUT THE SIGNAL LINES ON THE UPPER LAYER OF THE CONDUCTOR

BACKGROUND

Technical Field

This invention relates to a method for rearranging the layout to reduce the width of the CDA signal line installed on the upper surface of the conductor, which is connected to the CDA (Capacitor Detection Area) that constitutes the capacitive detection device. As the width of the CDA signal line broadens, issues arise: touch sensitivity is decreased due to the enhanced capacitance of the common electrode; detection errors manifest as a result of an increased time constant; and the Dead Zone induces errors in both object detection and the determination of touch coordinates. Contrasting these conventional approaches, this invention proposes a reduction in the width of the CDA signal line. By doing so, the invention effectively counters the challenges, enhancing touch detection sensitivity, minimizing detection errors, and diminishing the Dead Zone's width. This, in turn, prevents inaccuracies in object detection and the calculation of touch coordinates.

Background Art

In the past, mechanical buttons were used to dial phone numbers on mobile phones. However, recently, the input device has changed from mechanical to electronic, where touching the display device of the mobile phone lightly with a finger inputs the phone number. A prime example of this electronic input device is the capacitive type touch input device. This device detects the change in capacitance generated when an object such as a finger or pen approaches or touches the Capacitor Detection Area (hereinafter CDA) installed on the upper side of the display device, considering it as a valid input just like pressing a mechanical button.

Referring to FIG. 1, it is an embodiment of the capacitive touch input device modeling related to this invention. In FIG. 1, Cd represents the "interline capacitance", which is the capacitance formed between the sensing signal line and the driving signal line. Cprs is the "internal parasitic capacitance" formed against other signal lines or the semiconductor substrate inside the semiconductor IC. Ccm is the "common electrode capacitance" formed against the CDA and CDA signal line and conductors such as the common electrode or cathode of the display device.

One side of these three capacitances is connected to the sensing signal line, and in FIG. 1, the sensing signal line is equivalently represented by point P. The voltage supplied to the other side of the "internal parasitic capacitance" is either the DC power supply of the semiconductor substrate or the AC voltage caused by noise from another coupled signal line. The voltage supplied to the other side of the "common electrode capacitance", the common electrode voltage Vcm, is either the pixel voltage, which is a certain size of DC power supplied to the common electrode of the LCD or the cathode of the OLED, or the ground or certain DC voltage supplied to a separate conductor. The voltage supplied to the interline capacitance Cd is a driving voltage that changes in size from Vd1 to Vd2 or from Vd2 to Vd1.

This driving voltage supplies charge to the interline capacitance (Cd), and the charge supplied through the interline capacitance (Cd) induces charge sharing based on the sizes of the capacitances commonly connected to the sensing signal line, P point, determining the potential of the sensing signal line, P point. The common electrode voltage is a voltage of a predetermined size for the display of the display device, and it cannot be changed. Since the voltage supplied to the internal parasitic capacitance, Vprs, is a power coupled with the semiconductor substrate or another signal line, it cannot be changed. Therefore, only the driving voltage can be applied to the interline capacitance.

The present invention applies a driving voltage to the interline capacitance and supplies a charge to the sensing signal line through the interline capacitance. Based on the size of the object capacitance detected in the sensing CDA, the change in voltage in the sensing CDA is detected to determine the touch.

In FIG. 1, without the object capacitance (Cobj), i.e., in the non-touch state, the voltage stabilized at point P by the voltages supplied to the three capacitances is defined as Vp. The current flowing in the interline capacitance Cd due to the voltage Vd supplied to the interline capacitance (Cd) is defined as "id". The current flowing in the internal parasitic capacitance (Cprs) due to the voltage Vprs supplied to the internal parasitic capacitance (Cprs) is defined as "iprs". The current flowing in the common electrode capacitance (Ccm) due to the voltage Vcm supplied to the common electrode capacitance (Ccm) is defined as "icm".

According to Kirchhoff's current law, id=iprs+icm. Therefore, id=Cd*(Vd−Vp), iprs=Cprs*(Vp−Vprs), and icm=Ccm*(Vp−Vcm). Thus, Cd*(Vd−Vp)=Cprs*(Vp−Vprs)+Ccm*(Vp−Vcm). Rearranging this equation for Vp, we get $$Vp = \frac{Cd*Vd + Cprs*Vprs + Ccm*Vcm}{Cd + Cprs + Ccm}.$$

In the above equation, if the voltage Vd supplied to the interline capacitance (Cd) is replaced with Vd1, the voltage at point P when Vd1 is applied is $$Vp1 = \frac{Cd*Vd1 + Cprs*Vprs + Ccm*Vcm}{Cd + Cprs + Ccm}.$$

Similarly, the voltage at point P, when a larger voltage than Vd1, Vd2, is supplied to the interline capacitance (Cd) is $$Vp2 = \frac{Cd*Vd2 + Cprs*Vprs + Ccm*Vcm}{Cd + Cprs + Ccm}.$$

Therefore, the difference in voltage Vp2−Vp1 detected at the connection point P when two different sizes of voltage, Vd1 and Vd2, are applied to the interline capacitance (Cd) is as follows [Equation1].

$$Vp2 - Vp1 = \frac{(Vd2 - Vd1)*Cd}{Cd + Cprs + Ccm} \qquad [\text{Equation 1}]$$

The interline capacitance (Cd) is a capacitance formed between the sensing signal line and the driving signal line. It is determined by the mutual capacitance and the sum of the capacitances of the common electrode, which are serially connected by the sensing signal line and driving signal line, through parallel connection.

FIG. 2 pertains to an embodiment of the present invention relating to a display device module equipped with a capacitive detection device. Referring to FIG. 2, the capacitive detection device consists of multiple CDAs arranged in 3 rows and 4 columns. For simplicity in the drawing composition, the capacitive detection device is composed of 12 CDAs 100, but in reality, it consists of a large number of rows and columns, such as 25 rows and 25 columns or 20 (R)×30 (C). If a row is composed of 25 CDAs 100, each column contains 25 CDAs 100 ranging from the farthest Row1 to the nearest Row 25. At this time, the length of the CDA signal line 201 connected to the CDA located in the farthest Row1 from the semiconductor IC 400 controlling all operations for touch signal detection is the longest, while the length of the CDA signal line connected to the CDA located in Row25 is the shortest.

On the upper side of the display device where the capacitive detection device of the present invention is installed, the line resistance (R) of the CDA signal line made of transparent conductive materials such as ITO or IZO is determined as follows based on the resistivity (p) of the constituent material, signal line width (d_sig), and the length (l) of the signal line:

$$R = \rho \frac{l}{d\_sig} \, (\Omega) \quad \text{[Equation 2]}$$

Referring to [Equation 2], it can be seen that the resistance of the CDA signal line is proportional to the length of the CDA signal line and inversely proportional to its width.

Citing paragraph [0027] of Korean Registered Patent 10-1637422 (Application Number 10-2014-0177766, hereafter referred to as Cited Patent 1) submitted and registered by the applicant: "In terms of the wiring method of the sensor signal line 22 as in FIG. 6, the signal line lengths connected to the topmost sensor pattern 10(1,1) and the bottommost sensor pattern 10(1,5) differ, thus the wiring resistance of the signal line varies for each sensor pattern 10. If the resistance value increases, delays occur in touch signal detection. Therefore, if the width of the sensor signal line 22 wired to the top is wider than the width of the sensor signal line 22 wired to the bottom, it is possible to match the wiring resistance of the signal lines for all sensor patterns."

Also, referring to paragraphs [0102] to [0104] of Cited Patent 1: "As shown in FIG. 9, the size of the sensor pattern 10a far from the touch drive IC 30 and the width of its connected sensor signal line 22a are both larger than the size of the nearby sensor pattern 10e and its connected sensor signal line 22e width. In FIG. 9, the sensor pattern sizes are arranged in the order of 10a>10b>10c>10d>10e according to the distance from the touch drive IC30. At the same time, the widths of the sensor signal lines connected to each sensor pattern are arranged in the order of 22a>22b>22c>22d>22e."

In the embodiment of the cited Invention 1, as the CDA signal line is laid out at a greater distance and has a wider line width, the Dead Zone induced by the CDA signal line gradually expands as it approaches the semiconductor IC. As a result, touches made by a pen with a width narrower than that of the Dead Zone cannot be detected. Moreover, if a finger touches across a CDA with a Dead Zone and a CDA without one, the touch signal detected in the CDA with a Dead Zone is smaller than that in the CDA without one, leading to errors in determining touch coordinates. Moreover, in the CDA at far distances, the increase in the capacitance of the common electrode leads to a rise in the time constant. In systems where signals must be detected within a restricted time frame, if the detection duration is inadequate, it can result in signal detection errors. The enhanced capacitance of the common electrode also causes disparities in the detection voltage between near and far distant points, leading to issues like reduced detection sensitivity.

SUMMARY

Technical Problem

This invention was proposed to address the problems of the conventional technology mentioned above. It aims to use a different CDA signal line layout method from the embodiment of Cited Patent 1, minimizing object detection errors due to Dead Zones, touch coordinate determination errors, and touch detection errors.

Technical Solution

To achieve the above objectives, an embodiment of the present invention comprises: A Capacitor Detection Area (hereinafter CDA) positioned on the upper side of a conductor, which is connected at one side to a CDA signal line and not connected to any other signal(s). A CDA column comprising multiple said CDAs stacked on the same layer; An aforementioned distinct CDA signal line connected to each CDA forming the CDA column, without connecting to other signal line(s); A bundle formed by multiple of said CDA signal lines, arranged in one direction at one side of said CDA column; A semiconductor IC that controls the operation of the capacitive detection device to detect touch signals from said CDA. The CDA column where, based on the semiconductor IC, the quantity of the said CDA signal lines increases proportionally as the number of said CDAs increases from a far distance to a near distance, and where the area of the CDAs constituting the CDA column gradually decreases as the number of said CDAs increases from the far to the near. A CDA group composed of neighboring multiple said CDAs within said CDA column and the CDA signal lines connected to each said CDA; Wherein, the widths of the CDA signal lines constituting the CDA group are identical, and if the nth CDA signal line in the CDA column is selected as the sensing signal line, the (n−1) or (n+1) or both (n−1) and (n+1) CDA signal lines in the same CDA column are selected as the driving signal line(s). The driving voltage is applied to the said selected driving signal line(s) to detect the object capacitance added to the sensing CDA connected to the said sensing signal line.

Furthermore, when no object capacitance is added to the said sensing CDA connected to the said nth sensing signal line, the voltage detected from the nth sensing signal line is determined by the following [Equation 1], and the voltage detected from the said nth sensing signal line due to the object capacitance Cobj added to the said sensing CDA connected to the said nth sensing signal line is determined by the following [Equation 2]. The object capacitance is detected based on the result of the [Equation 1]-[Equation 2].

$$Vp2 - Vp1 = \frac{(Vd2 - Vd1) * Cd}{Cd + Cprs + Ccm} \quad \text{[Equation 1]}$$

$$Vp2 - Vp1 = \frac{(Vd2 - Vd1) * Cd}{Cd + Cprs + Ccm + Cobj} \quad \text{[Equation 2]}$$

Wherein:
a) Cd is the interline capacitance formed between the sensing CDA and the driving CDA.
b) Ccm is the common electrode capacitance formed when the sensing CDA and the said conductor are facing each other.
c) Cprs is the parasitic capacitance formed on the sensing CDA signal line within the semiconductor IC.
d) Vp1 is the voltage detected at the sensing CDA when the driving voltage Vd1 is applied to the driving CDA.
e) Vp2 is the voltage detected at the sensing CDA when the driving voltage Vd2 is applied to the driving CDA.

Furthermore, the value of [Equation 1] is stored in memory and is recalled from memory to be compared with a real-time detection value of [Equation 2].

Furthermore, in the said CDA column, the length of the CDA signal line connected to the CDA located far from the semiconductor IC is longer than that connected to the CDA located nearer to the semiconductor IC.

Furthermore, a second common electrode capacitance is formed between the sensing signal line and the conductor, and a first common electrode capacitance is formed between the (n−1)th driving signal line and the conductor, and a third common electrode capacitance is formed between the (n+1)th driving signal line and the conductor.

When the driving voltage is applied to the (n−1)th driving signal line, the first and second common electrode capacitances connect in series. This series connection acts as the fourth common electrode capacitance, supplying charge to the sensing signal line.

Similarly, when the driving voltage is applied to the (n+1)th driving signal line, the third and second common electrode capacitances connect in series. This series connection acts as the fifth common electrode capacitance, supplying charge to the sensing signal line.

Furthermore, the (n−1)th driving signal line and the (n+1)th driving signal line are commonly connected to the driving part of the semiconductor IC. When the driving voltage provided by the driving part is applied to both the (n−1)th driving signal line and the (n+1)th driving signal line, the first time constant of the sensing signal line is determined by the following [Equation 3].

$$RC1 = \rho\varepsilon\frac{l^2}{d2} \quad \text{[Equation 3]}$$

Wherein,
a) R is the resistance of the sensing signal line.
b) C1 is the capacitance value formed on the sensing signal line due to the parallel connection of the fourth and fifth common electrode capacitances.
c) ρ is the resistivity of the conductor forming the sensing signal line and the driving signal line.
d) ε is the dielectric constant of the insulator positioned between the sensing/driving signal lines and the facing conductor.
e) d2 is the separation distance between the sensing/driving signal lines and the facing conductor.
f) l is the length of the sensing and driving signal lines facing the conductor, assumed to be of equal length.

Furthermore, the second time constant RC2 due to the mutual capacitance formed between the sensing signal line and the driving signal line, varies by an identical increase or decrease of 20% to 40% in response to variations in the increase or decrease of the signal line width d_sig of the sensing signal line and the driving signal line.

Wherein, R represents the value of the line resistance of the sensing signal line, and C2 represents the value of the mutual capacitance formed between the sensing signal line and the driving signal line.

Furthermore, all the CDA signal line widths of the multiple CDA groups forming the CDA column are identical.

Furthermore, within the said CDA column, the width of the CDA signal line for a certain CDA group is identical to the width of a nearby CDA signal line that does not belong to that certain CDA group.

Furthermore, the CDA signal line width of multiple CDA groups constituting the said CDA column is characterized by being different for each CDA group.

Furthermore, the said conductor is the common electrode of an LCD display device or the cathode of an OLED display device. The CDA signal line is positioned on the upper side of the pixels forming the display device. The width of the CDA signal line or the combined value of its width and the distance between adjacent CDA signal line, which defines the pitch of the CDA signal line, is determined as m1 times the SPP (sub pixel pitch). (Where m1 is a positive integer or a positive real number.)

Furthermore, for the multiple sub pixels composing the Pixel, the value of m1 is different for each sub pixel.

Furthermore, the said conductor is the common electrode of an LCD display device or the cathode of an OLED display device. The CDA signal line is positioned on the upper side of the pixels forming the display device. The width of the CDA signal line or the combined value of its width and the distance between adjacent CDA signal line, which defines the pitch of the CDA signal line, is determined as n times the PP (pixel pitch). (Where n is a positive integer or a positive real number.)

Furthermore, the CDA signal line is laid out diagonally in a zigzag shape.

Furthermore, the said conductor is the common electrode of an LCD display device or the cathode of an OLED display device. The CDA signal line is positioned on the upper side of the pixels forming the display device. The width of the CDA signal line, or the combined value of its width and the distance between adjacent CDA signal lines, which defines the pitch of the CDA signal line, is determined based on m2 times twice the SPP (sub-pixel pitch), where twice the SPP represents the pitch of two adjacent sub-pixels. (Where m2 is a positive integer or a positive real number.)

Furthermore, for certain plural CDA groups, the value of m1 or n varies from one CDA group to another, Furthermore, the value of the mutual capacitance formed between the sensing signal line and the driving signal line increases by a ratio of 20% to 30% when the separation distance between the sensing signal line and the driving signal line is reduced by a ratio of 100%.

Furthermore, the magnitude of the mutual capacitance formed between the sensing signal line and the driving signal line is proportional to the length "l" of the driving signal line and the length "l" of the sensing signal.

Furthermore, the CDA column group consisting of the aforementioned multiple CDA columns, and the semiconductor IC selects all CDAs from an arbitrary nth row as sensing CDAs to perform processing for detecting the object capacitance. Subsequently, the semiconductor IC selects all CDAs from the (n+1)th row as sensing CDAs for the next round of capacitive detection processing.

Furthermore, all CDAs of the row where the processing to detect the object capacitance is conducted start processing simultaneously.

Furthermore, a single ADC and a single DAC are used during the processing.

Furthermore, for multiple CDA column groups, processing commences in another CDA column group after the processing in one CDA column group concludes.

Furthermore, each CDA column is equipped with a multiplexer for selecting a sensing signal line, and the multiplexer selects one sensing signal line from the CDA column.

Furthermore, each CDA column is equipped with a multiplexer for selecting a driving signal line, and the multiplexer selects one or multiple driving signal lines from the CDA column.

Furthermore, after the processing concludes, the detected voltages from each sensing CDA are individually stored in an analog storage device.

Furthermore, The analog storage device is characterized as a Sample & Hold.

Furthermore, the multiple voltages stored in the analog storage device from the sensing CDAs are sequentially selected using a multiplexer and then digitized using the ADC.

DETAILED DESCRIPTION

Figure 1:
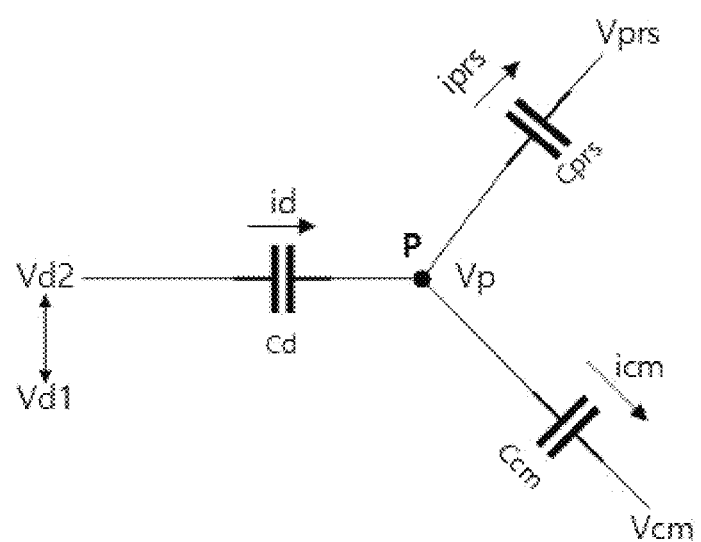
FIG. 1 is an embodiment of the present invention related to the modeling of the capacitive touch input device.

The terms used in this invention have been chosen considering their functions in this invention and the general terms used currently. However, these might change depending on the intention of technicians in the field, precedents, or the emergence of new technologies. In specific cases, terms chosen arbitrarily by the applicant have been used, and in these cases, their meaning will be detailed in the relevant part of the description of the invention. Thus, terms used in this invention need to be defined based on their meaning and the overall content of the invention.

The sizes and thicknesses of each component shown in the drawings are depicted arbitrarily for explanatory convenience, and the invention is not limited to what's depicted. In the drawings, the relative sizes like width, etc., are exaggerated to clarify various layers and areas. When a section or layer is said to be "on top" or "above" or "upper" or "upper surface" of another, this includes not just being directly on top, but also possibly having another section in between. "Below" or "lower" or "lower surface" holds the same meaning.

Throughout the specification, when it's stated that a part "includes" a certain component, unless specifically stated otherwise, it means that it might include other components as well. Also, terms like " . . . unit", "module", etc., mentioned in the specification mean a unit that processes at least one function or operation, which could be implemented in hardware, software, or a combination of both.

Definition of Terms

The capacitance symbol refers to both the symbol of the capacitor in diagrams and the magnitude of the capacitance. For example, Cprs represents a capacitance symbol in the drawings that refers to the capacitance formed by the sensing signal line and the substrate of the semiconductor IC. It can also refer to a specific capacitance value. When there's potential confusion, they are distinguished as "capacitor" or "capacitance."

Furthermore, facing the CDA 100, objects such as fingers or pens that form capacitance are denoted as Object 20.

Also, among the multiple CDA signal lines 200, those based on the provided equation in this invention for voltage detection (or signal detection) are termed Sensing Signal Line. The CDA 100 connected to the sensing signal line is termed Sensing CDA. Signal lines that are adjacent to the sensing signal line, form interline capacitance with it, and to which a driving voltage is applied, are denoted as Driving Signal Line.

Moreover, other signal lines within the semiconductor IC 400 required for its operation, for example, Logic Signal Line, Oscillator Signal Line, Power Line, etc., are differentiated from the invention's CDA signal line 200 and labeled "Different Signal Line."

Also, while CDA 100 and its connected CDA signal line 200 are distinct geometrically, they bear the same electrical meaning. Hence, "detecting voltage from Sensing CDA" means the same as "detecting voltage from the sensing signal line connected to that Sensing CDA." Moreover, under the semiconductor IC's control, a CDA can sequentially operate as Sensing CDA, Driving CDA, or an inactive CDA. In this specification, "voltage detected from CDA" means the same as "voltage detected when CDA operates as Sensing CDA." Additionally, distances and directions are based on the semiconductor IC 400. Far distances mean far from the semiconductor IC, and near distances signify closeness to the semiconductor IC 400.

Also, a single column formed by multiple CDAs is termed CDA Column, and multiple CDA columns together form a column group.

Moreover, the pixels of a display device are composed of Red/Green/Blue or White sub-pixels. In this specification, pixels are formed by the three primary colors, R/G/B, and the short side length of the sub-pixel is defined as the Sub Pixel Pitch. The Sub Pixel Pitch includes the BM (Black Matrix). Tripling the Sub Pixel Pitch gives the Pixel Pitch.

Furthermore, the capacitance detection device of this invention is a "system" that applies a driving voltage to the driving signal line adjacent to the sensing signal line and detects voltage from the sensing signal line after its potential stabilizes. The equation representing the voltage detected from the sensing signal line after applying driving voltage to the interline capacitance is expressed as the "transfer function" of the system.

Referencing the attached drawings, the following provides a detailed explanation so that those skilled in the art to which this invention belongs can easily implement the embodiments of the invention. However, the invention can be implemented in various forms and is not limited to the embodiments described here. Parts unrelated to the description have been omitted in the drawings, and similar parts throughout the specification are represented with similar reference symbols.

Figure 2:
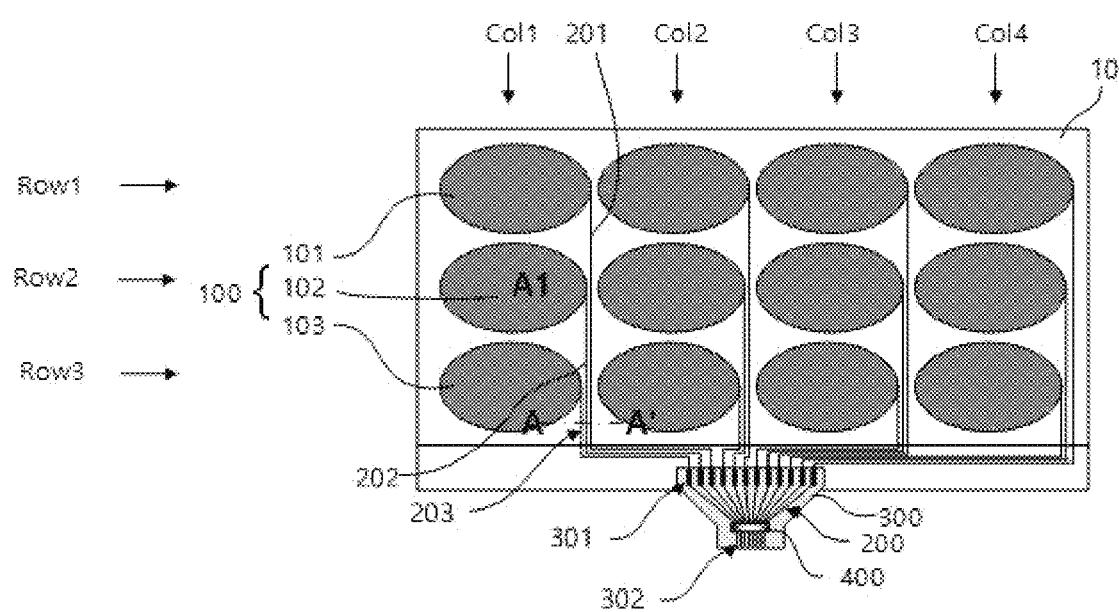
FIG. 2 is an embodiment of the invention related to the display device module equipped with the capacitive detection device.

FIG. 2 is an embodiment of this invention related to a display device module with a capacitance detection device installed. The capacitor detection area 100 of the capacitance detection device is made of a transparent conductor and has an independent area and can be located either within the display device 10, on the upper surface of the display device 10, or installed on household appliances or industrial machinery. From one side of the CDA 100, the CDA signal line 200 connected to the aforementioned CDA electrically links the CDA with the semiconductor IC 400, which is located either on one side of the display device 10 or outside of the display device 10. It is connected to the semiconductor IC 400 using the material for connection 300, and signals inputted to the semiconductor IC are forwarded to the signal processing unit 410.

The CDA 100 used in display devices 10 or industrial machines is covered with protective materials like tempered glass, plastic, or film. The CDA 100 can be geometrically shaped like a circle, rectangle, triangle, etc., and is usually of the same or similar shape. When an object such as a human finger or pen comes into proximity or contacts the upper side of the CDA 100, object capacitance (Cobj) forms based on the mutual gap distance and facing area between the object and the CDA. When a touch by an object occurs, the object capacitance (Cobj) is formed by the distance "d1" and facing area "s1" between CDA 100 and the object 20, and the capacitance of the formed object capacitance (Cobj) is given by $$Cobj = \varepsilon \frac{s1}{d1}(F).$$

$\varepsilon$ is the permittivity of the material between CDA 100 and the object 20, with the combined permittivity of protective layer 7 like glass or film, and (if the object is floating in air) air being applied.

Within the display device, the position of CDA 100 is as follows:
1. For LCDs: It is formed on the top surface of the Color Filter Glass, that is, on the Color Filter Glass where it bonds with the polarizer film, or it can be formed on the lower or upper side of the polarizer film, or installed on the lower surface of the protective layer 7.
2. For OLED case 1: It's formed on the surface of the Passivation after coating Passivation on the Cathode surface.
3. For OLED case 2: It is formed on the upper side of the PI (Polyimide) series thin film, which serves as the encapsulation substrate for OLEDs or on the upper side or lower side of the encapsulation glass.

In the case of LCDs, the CDA is located on the upper side of the common electrode composed of conductive materials like ITO or IZO. Similarly, in OLEDs, the CDA is positioned on the upper side of Cathode composed of ITO or IZO. When the capacitive detection device of the present invention is used in places other than the display device, such as the control panel of an aircraft or a car switch, a conductor must be placed on the bottom of the CDA. This is to ensure that the CDA signal line width is not included in the time constant according to the subsequent equation. While the conductor of the display device needs to be transparent, like ITO or IZO, in cases where it's not installed on the surface of the display device, such as a touch button on an elevator, non-transparent conductive materials like iron, copper, silver, or gold can be used.

In this specification, based on the position of the semiconductor IC 400, the direction in which the number of CDA signal lines 200 increases or decreases is defined as a column. In FIG. 2, since the number of signal lines decreases from 3 to 1 from the bottom to the top where the semiconductor IC is located, the vertical direction can be defined as a column. Also, the direction orthogonal to the column is defined as a row. In this invention, a set of multiple CDAs included in the same column and constituting the same Signal Line Bundle (or Harness) (hereinafter referred to as SLH) is referred to as "CDA column." In FIG. 2, CDA 101 to CDA 103 are included in the same column, and the signal lines 201 to 203 connected to them form an SLH, hence they are a CDA column. There are four CDA columns from Col1 to Col4, and one CDA column consists of three CDAs 100. As mentioned earlier, the capacitive detection device of the present invention, consisting of 20 Rows×15 Columns of CDAs, comprises 15 CDA columns, and each CDA column contains 20 CDAs 100. Therefore, FIG. 2 is just a simple embodiment used in this specification, and in reality, the capacitive detection device of the present invention consists of hundreds or nearly thousands of CDAs.

The material for connection 300 is manufactured using FPC (Flexible Printed Circuit), COF (Chip On Film), or TCP (Tape Carrier Package), and the semiconductor IC 400 is located on one side of the material for connection 300. One side of the material for connection 300, the attached part 301, is connected to the display device 10 through a bonding process by thermal compression or also connected using a connector. The CDA signal line 200 originating from the semiconductor IC 400 is connected to the CDA signal line placed on the display device 10 through the attached part 301 and the said CDA signal line placed on the display device constitutes the CDA column.

According to the physical law, the line capacitance Cd and the common electrode capacitance Ccm are formed on the sensing signal line and the driving signal line, and the object capacitance Cobj is formed by touch from the object on the sensing CDA 100. The semiconductor IC 400 sequentially distinguishes the same CDA signal line 200 as a sensing signal line and a driving signal line or an inactive CDA signal line by the time-sharing method. After applying the driving voltage to the driving signal line adjacent to the sensing signal line, the voltage formed on the sensing signal line is detected based on the charge sharing phenomenon, and comprehensive processing, such as calculating touch coordinates, is performed. The connection part 302 formed on the other side of the material for connection 300 is connected to a PCB (not shown) and the like. Through the connection part 302, control signals, power, and other necessities required by the semiconductor IC 400 are supplied. Additionally, Through the connection part 302, information outputted by the semiconductor IC 400, such as the coordinates of the object or information received from the pen, is outputted and transferred to an external Host CPU.

The following is an embodiment of the present invention regarding the formation of the common electrode capacitance. The CDA 100 is placed facing the LCD's common electrode layer (Vcom Layer) or the OLED's Cathode layer or conductive layer at a specific distance and predetermined area. In this configuration, a common electrode capacitance with a Capacitance of $$Ccm = \varepsilon \frac{S2}{d2} Ω|$$

is formed between the CDA/CDA signal line and the display device.

Figure 3:
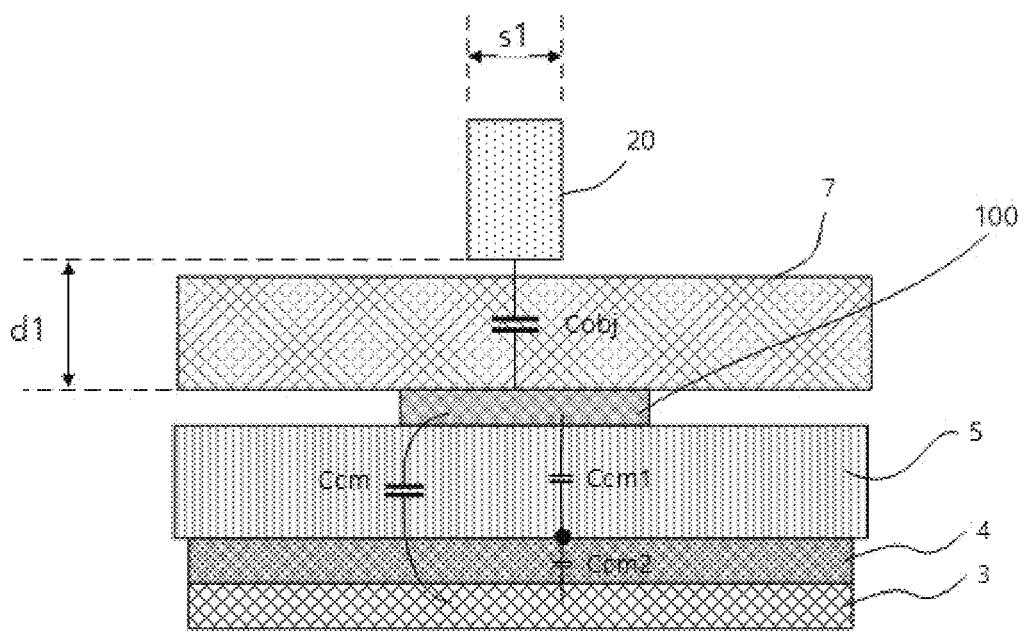
FIG. 3 is an embodiment of the invention that pertains to the formation of the common electrode capacitance, denoted as Ccm.

Referring to FIG. 3, which is an embodiment of the present invention regarding the formation of the common electrode capacitance Ccm using an LCD display device. Referring to FIG. 3, the CDA100 is located on the top surface of the Color Filter Glass 5. Below the Color Filter Glass 5, there are Red/Green/Blue Color Layers 4, and below the Color Layer 4 is the conductive common electrode 3. Since the dielectric constants of the Color Filter Glass 5 and the Color Layer 4 are different, between the CDA100 and the Color Layer 4, there is a capacitance Ccm1 based on the dielectric constant of the Color Filter Glass 5, and a capacitance Ccm2 based on the dielectric constant of the Color Layer 4, which are serially formed. Therefore, the common electrode capacitance Ccm formed between the CDA100 and the common electrode 3 is a composite capacitance formed by the serial connection of Ccm1 and Ccm2.

Although not shown in FIG. 3, the CDA signal line 200 connected to the CDA100 is also a part of the CDA100. Therefore, a common electrode capacitance is also formed between the CDA signal line 200 and the common electrode 3. The value of the common electrode capacitance (Ccm) due to CDA 100 consists of the combined common electrode capacitance formed by the CDA 100 and the common electrode capacitance formed by the CDA signal line 200.

Assuming that FIG. 3 is for OLED instead of LCD, the reference numeral 5 represents the encapsulation substrate, numeral 3 represents the Cathode, and numeral 4 is substituted by the passivation on the upper side of the Cathode. Since Ccm1 and Ccm2 are formed in the same way as in the LCD embodiment, it is possible to calculate the value of Ccm using this information.

A common electrode voltage of a certain magnitude is supplied to the common electrode formed from a conductor in the LCD or the Cathode in the OLED. Voltage fluctuations are not allowed to ensure the normal display of the screen. The [Equation 1] and subsequent [Equation 3] in this invention represent the transfer function of a system that detects voltage differences due to charge sharing phenomena in the parasitic capacitance and the common electrode capacitance connected to the interline capacitance formed between the driving signal line and the sensing signal line when a driving voltage is applied to the driving signal line. Referring to the [Equation 1], it is characterized by the presence of a capacitance supplying charge according to the driving voltage application in both the numerator and denominator of the formula. Therefore, the common electrode voltage Vcm connected to the common electrode capacitance Ccm cannot be the driving voltage as a DC voltage, so it can only be located in the denominator of [Equation 1]. As a result, as the size of the common electrode capacitance increases, the magnitude of the voltage detected from the sensing signal line decreases, i.e., the detection sensitivity decreases.

Figure 4:
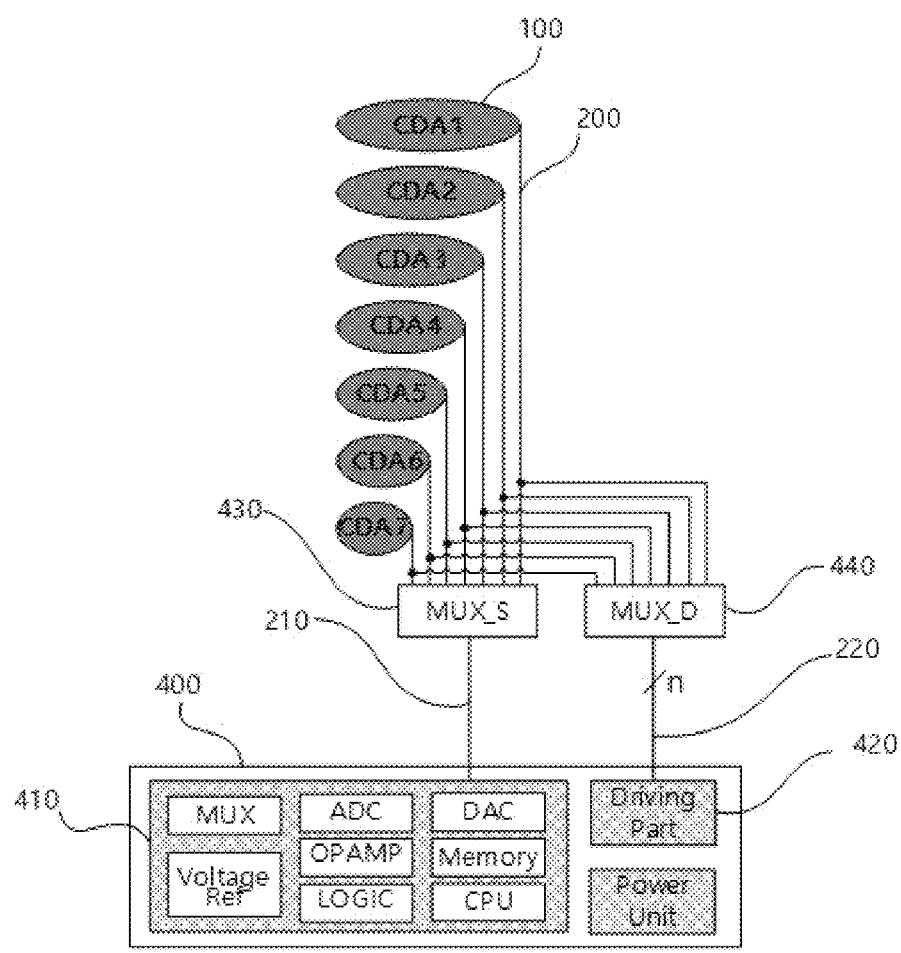
FIG. 4 is an embodiment of the invention concerning the capacitive detection device comprised of the single CDA column and its connection to the semiconductor IC.

FIG. 4 illustrates an embodiment of the invention relating to a capacitance detection device and semiconductor IC connection composed of a single CDA column. Referring to FIG. 4, a single CDA column consists of seven CDAs. Each CDA included in the CDA column is connected to two multiplexers, 430 and 440, through the CDA signal line 200. Multiplexer for selecting sensing signal line 430, hereinafter referred to as MUX_S, is placed for each CDA column and is a multiplexer that selects one sensing signal line 210 from all CDA signal lines 200 of the CDA column. The sensing signal line 210 selected by MUX_S 430 is connected to the signal processing unit 410 of the semiconductor IC 400.

Meanwhile, all CDA signal lines 200 of the CDA column are also input to the multiplexer for selecting driving signal line 440, hereinafter referred to as MUX_D. MUX_D 440 is a multiplexer that selects one or more driving signal lines neighboring the sensing signal line. For example, if the CDA signal line connected to CDA4 in FIG. 4 is selected as the sensing signal line 210 by MUX_S 430, MUX_D 440 may select one of the driving signal lines connected to the neighboring CDA3 or CDA5 of CDA4, or select a pair of driving signal lines consisting of CDA3 and CDA5, or even select multiple pairs of driving signal lines such as pairs of (CDA3, CDA5) and (CDA2, CDA6). The one or more driving signal lines 220 selected by MUX_D 440 are connected to the driving part 420 of the semiconductor IC 400, and the driving voltage provided by the driving part 420 is applied. (The driving signal line 220 output from MUX_D 440 being denoted as 'n' signifies that a single or multiple driving signal lines can be chosen.)

The next is an embodiment of the present invention regarding the configuration of the signal processing unit 410 of the semiconductor IC 400. The signal processing unit 410 of the semiconductor IC 400 detects the voltage according to the charge sharing phenomenon between capacitors connected to the sensing CDA, based on [Equation 1]. Therefore, if the object capacitance Cobj is added, it detects voltage changes due to changes in system components and performs functions to extract the coordinates of the object according to touch or non-touch.

From multiple CDA columns that form a single column group, one sensing signal line 210 is selected from each, and the same row where processing starts and finishes at the same time is formed. After processing is complete, the voltage detected from each sensing CDA is individually stored in an analog storage device such as Sample & Hold. Multiple sensing CDA voltages stored in the analog storage device are digitized by an ADC using a time-sharing method and stored in memory, then used to determine the size of the object capacitance based on the equation of this invention. For this, a multiplexer is installed in the signal processing unit 410 to sequentially select one of the multiple Sample & Hold devices.

An embodiment of the present invention determines the touch by the difference between the voltage detected based on the fixed value and initial value of [Equation 1] when there is no touch, and the voltage detected in real-time based on the subsequent [Equation 3]. Therefore, the value of the initial value of [Equation 1] must be stored in memory, and it is recalled for comparison with the real-time detection value based on [Equation 3]. For this process, an ADC, DAC, and memory are installed in the signal processing unit 410 of the semiconductor IC 400 to record the value of [Equation 1]. Additionally, analog operations to extract the difference between the recalled voltage value based on the fixed value of [Equation 1] and the real-time measured voltage value based on [Equation 3] are generally performed in an operational amplifier, so an OPAMP is installed in the signal processing unit 410. Moreover, precise power is required for analog signal processing in the ADC or DAC, so a Voltage Reference is required. Additionally, although many circuit components such as Sample & Hold and Decoder are required, they are omitted for convenience.

The following is an embodiment related to the driving part 420 and other functional elements of the semiconductor IC. The driving part is a block responsible for applying a driving voltage to the driving signal line 220. The driving part 420 uses voltages such as Vd1, Vd2, or ground generated from the power unit to apply the driving voltage to the driving signal line 220. The semiconductor IC's CPU or Logic section determines the turn-on and turn-off times of the switch supplying power by controlling the switch.

The power unit generates voltages required by the driving part, the voltage needed by Voltage Ref, or the CPU's power, effectively generating all the power required within the semiconductor IC. The voltage produced by the power unit can also be delivered to a display device and can be used by a multiplexer placed in the display device or by the driving part.

The CPU computes the voltage detected from the CDA and calculates the position, namely, the coordinates of the object. It also performs timing control of the circuit elements included in the signal processing unit 410. The Logic section controls the CDAs included in the CDA column and column group to determine the order of the sensing signal line and driving signal line, and also controls the operation order and process of ADC or DAC. Such a process can also be performed by the CPU.

In this invention, ADC and DAC are used to detect the voltage formed in sensing CDA. While multiple ADCs or DACs can be used, it is preferable to use a single DAC and ADC to reduce the area of the semiconductor IC. When using one DAC and one ADC, processing is performed for multiple column groups using a time-division method. Processing is also performed on CDAs included in the selected column group's CDA column using a time-division method. For example, in a capacitive detection device divided into odd and even column groups, processing of the odd column group is first carried out, followed by that of the even column group, alternating repeatedly.

Each column group consists of multiple CDA columns, and each CDA column comprises multiple CDAs. In an embodiment of the invention that detects touch, i.e., object capacitance, processing is first carried out for all CDAs in the same row of each CDA column of the same column group. It then proceeds sequentially from the first row of CDA to the last row of CDA in the odd column group. After processing is completed in the odd column group, processing proceeds from the first row to the last row of CDA in all CDA columns belonging to the even column group. This alternating and repetitive processing involves the ADC and DAC in every step using a time-division method.

As the number of CDA columns undergoing processing increases, the number of sensing CDAs from which the ADC and DAC must extract signals also increases. As a result, the operation time of the ADC and DAC increases, leading to discharges in the sensing signal lines of columns processed later. This can cause distortion in the detected signal. To address this issue, column groups, which are assemblies of multiple CDA columns, are used. For example, for 20 CDA columns, they can be divided into two column groups: the left 10 columns and the right 10 columns. They can also be distinguished into odd-numbered column groups consisting of odd-numbered CDA columns and even-numbered column groups consisting of even-numbered CDA columns.

The following is an embodiment of the invention regarding the formation of interline capacitance and the method of applying a driving voltage to the driving signal line. When processing to detect object capacitance from CDA 102 indexed as A1 is underway, the CDA signal line 202 connected to A1 CDA 102 is the sensing signal line 210, selected by MUX_S, and connected to the signal processing unit 410. The two neighboring CDA signal lines 201 and 203 next to A1's CDA signal line 202 are driving signal lines 220, selected by MUX_D 440 and connected to the driving part 420 shown in FIG. 4. At this time, an interline capacitance is formed between the sensing signal line 202 and the driving signal lines 201/203.

Figure 5A:
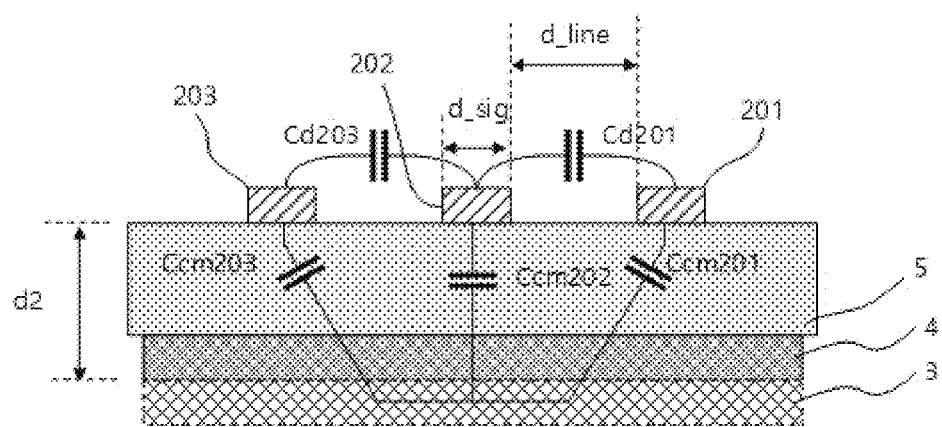
FIG. 5A is an embodiment of the invention that relates to the formation of capacitance between the sensing signal line and its two neighboring driving signal lines.
Figure 5B:
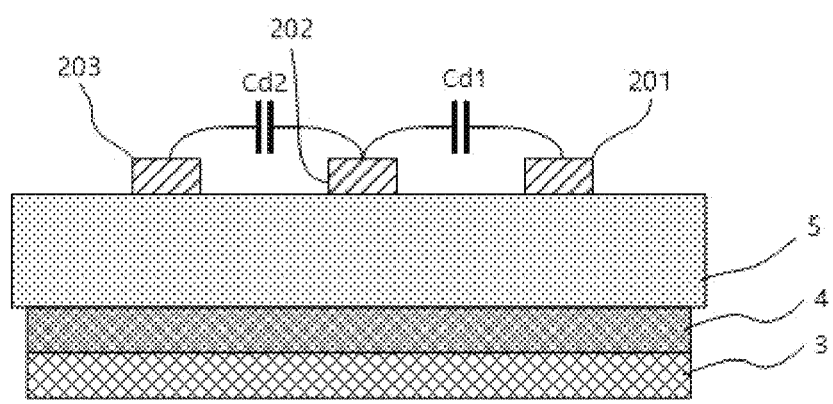
FIG. 5B is an embodiment of the invention related to the equivalent circuit of FIG. 5A.

FIG. 5A is an embodiment of the present invention concerning the formation of capacitance between the sensing signal line and the two neighboring driving signal lines, showing the cross-section of A and A' of FIG. 2. FIG. 5B is an equivalent circuit of the embodiment in FIG. 5A.

As seen in FIGS. 5A and 5B, the sensing signal line 202 and the driving signal line 201 situated to the right of the sensing signal line 202 are composed of two planar shapes separated by a certain distance (d_line). When a driving voltage is applied to the driving signal line 201, a mutual capacitance Cd201 is formed, which is proportional to the length of the CDA signal line between the (not shown) driving signal line 201 and the sensing signal line 202 and is influenced by the signal line width (d_sig) and the separation distance between the signal lines (d_line). The driving voltage is also applied identically to the driving signal line 203, so mutual capacitance Cd203 forms between driving signal line 203 and sensing signal line 202.

The interline capacitance formed between the driving signal line and the sensing signal line is a physical quantity that changes in size according to the width (d_sig) of the CDA signal line. If the width (d_sig) of the driving signal line and the sensing signal line widens, the mutual capacitances, Cd201 and Cd203, also increase. Thus, as in the cited invention's embodiment, if the CDA signal line width increases the farther it goes, the expanded signal line width impacts the size of the mutual capacitance, making it larger.

As illustrated in the embodiment of Citation Invention 1, when the width of the CDA signal line increases with distance, the size of the Mutual Capacitance, which is one of the elements constituting the interline capacitance (Cd), also enlarges as the distance extends. Therefore, the magnitude of the interline capacitance grows as it spans further away. Therefore, the further the CDA is, the larger the interline capacitance (Cd) in the denominator of the [Equation 1], decreasing the detection sensitivity of the object's capacitance (i.e., the detected voltage size decreases). Moreover, there's an issue where a difference in detected voltage arises between the near CDA and the far CDA for the same object capacitance. This leads to a detection error, where different voltages are detected for the same magnitude of object capacitance depending on the location of the CDA.

Meanwhile, the interline capacitance (Cd) is determined by the sum of the mutual capacitance and the series-connected common electrode capacitance (described later). The sensing signal line 202 opposes the conductor common electrode 3 with a width (d_sig) and faces the color filter glass 5 and the color layer 4 at a specific distance. Therefore, in the same principle as the common electrode capacitance, Ccm in FIG. 3, the common electrode capacitance Ccm202 forms between the sensing signal line 202 and the common electrode 3 or conductor. Similarly, the common electrode capacitance Ccm201 forms between the driving signal line 201 and the common electrode 3, and between the driving signal line 203 and the common electrode 3, the common electrode capacitance Ccm203 forms.

When a driving voltage is applied to the driving signal line 203 and the sensing signal line 202 is in a floating (Floating) or high impedance (Hi-z) state, the current supplied to the driving signal line 203 is transmitted to the sensing signal line 202 through Ccm202 and Ccm203, which are connected by conductor 3. Consequently, Ccm203 and Ccm202 are equivalently series-connected capacitances, which can be considered as a single capacitance parallel to the mutual capacitance Cd203. In this way, an equivalent interline capacitance, Cd2, forms between the sensing signal line 202 and the driving signal line 203. Similarly, an equivalent interline capacitance, Cd1, forms between the sensing signal line 202 and the driving signal line 201.

If the same driving voltage is applied to the right driving signal line 201 and the left driving signal line 203 of the sensing signal line 202, Cd1 and Cd2 can be represented as a parallel-connected single interline capacitance, as shown as Cd in Fig. In this manner, whether applying a driving voltage to one driving signal line adjacent to the sensing signal line, or applying driving voltage from both directions to a pair of neighboring driving signal lines, or even applying driving voltage to multiple pairs, such as two pairs or three pairs of driving signal lines, it can be equivalently modeled as having a single interline capacitance between the sensing signal line and the driving signal line. One side of this equivalent interline capacitance is connected to the sensing signal line, while the driving voltage is applied to the other side.

Interline capacitance Cd1 is determined by the sum of the described mutual capacitance and the series-connected common electrode capacitances, Ccm201 and Ccm202. The same principle applies to Cd2, determined by the sum of the mutual capacitance and the series-connected common electrode capacitances, Ccm203 and Ccm202. Cd1 and Cd2 can be equivalently modeled as a single interline capacitance Cd in parallel. Similarly, the mutual capacitances Cd201 and Cd203 can be equivalently modeled as a single mutual capacitance in parallel. Additionally, the two series-connected common electrode capacitances (Ccm202/Ccm201, Ccm202/Ccm203) can also be equivalently modeled as one parallel-connected common electrode capacitance.

The following is an embodiment of the present invention regarding the "internal parasitic capacitance (Cprs)" formed when the sensing signal line is laid out inside the semiconductor IC 400. The semiconductor IC 400 comprises multiple layers of insulating layers and multiple layers of conducting layers stacked with specific patterns on the substrate that constitutes the semiconductor IC. It also contains numerous elements with electrical characteristics and multiple wirings. For instance, Source Metal Layer, Gate Metal Layer, or power layers that include the ground, or Clock, analog/digital signals, etc., constitute the conductive layer (Signal Layer). These signal layers are patterned with conductive metal and separated by an insulating layer to avoid short circuits between neighboring signal layers.

Figure 6:
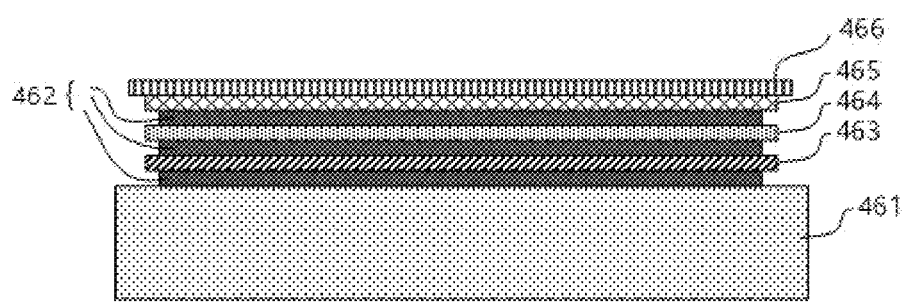
FIG. 6 is an embodiment of the invention related to the layer configuration of the semiconductor IC.

FIG. 6 is an embodiment of the present invention related to the layer structure of the semiconductor IC 400. Referring to FIG. 6, on the upper side of the silicon substrate 461 there is an insulating layer 462, and on top of the insulating layer, there are the first signal layer 463, the second signal layer 464, and the third signal layer 465. Each signal layer is patterned as a metal line, which transmits signals, supplies power, or acts as a ground. In this embodiment, three signal layers are exemplified, but more than three can be used.

Inside the semiconductor IC 400, the sensing signal line 210, the driving signal line 220, signal processing unit 410, driving part 420, and all other components that constitute the semiconductor IC 400 are laid out at any position within the first signal layer 463 to the third signal layer 465 inside the semiconductor IC 400. At this time, based on the distance (d3) and facing area (s3) between the sensing signal line 210 and the lower silicon substrate 461 or "other signal lines", as well as the distance (d4) and facing area (s4) with "other signal lines" in the upper layers, two capacitances are formed:

$$Cprs1 = \varepsilon 3 \frac{S3}{d3} \text{ and } prs2 = \varepsilon 4 \frac{S4}{d4}$$

(where ε3 and ε4 are the dielectric constants of each insulating layer). These two capacitances are connected in parallel to the sensing signal line 210, so their sum is equivalent to a single capacitance, referred to as the internal parasitic capacitance (Cprs). Also, the sensing signal line 210 forms parasitic capacitances in the space between the "other signal lines" to its left and right. The aforementioned internal parasitic capacitance includes all parasitic capacitances formed when the sensing signal line 210 is laid out inside the semiconductor IC 400. This internal parasitic capacitance (Cprs) can be modeled as a capacitance with one side connected to the sensing signal line and the other side having the voltage applied to the "other signal lines" facing the sensing signal line, as shown in FIG. 1, where one side is connected to the sensing signal line at point P and the other side has a specific voltage, Vprs.

Next is an embodiment of the present invention on the method of detecting the object capacitance when an object's capacitance is added due to touch. Until now, we have described the formation of the interline capacitance (Cd), common electrode capacitance (Ccm), and internal parasitic capacitance (Cprs) that constitute the capacitance detection device when no object capacitance is added, i.e., when no touch has occurred, and the method of applying a driving voltage to the interline capacitance. And using the modeling of FIG. 1, we derived the system transfer function, [Equation 1]

Referring to FIG. 3, when an object 20 is located on the CDA 100 with a facing area of s1 and a separation distance of d1, an object capacitance (Cobj) forms between the CDA 100 and the object 20 and the capacitance size is $$Cobj = \varepsilon \frac{S1}{d1}.$$

The factors determining the separation distance "d1" are the protective layer 7 composed of protective glass or protective film between the CDA 100 and the object 20, transparent adhesive (not shown) that bonds the CDA 100 to the protective layer 7, and an air layer when the object 20 does not touch the protective layer 7. The size of the object capacitance (Cobj) is determined by the serial composite capacitance formed by the materials between the object and the CDA, such as the capacitance (Cair) formed based on the dielectric constant (ε) of the air layer and its thickness, the capacitance (Cgls) formed based on the dielectric constant (ε) of the protective layer material and its thickness, and the capacitance (Cadh) formed based on the dielectric constant (ε) of the transparent adhesive material and its thickness.

In one embodiment, when the CDA is designed in a rectangular shape of 4 mm×4 mm and a touch is applied to the CDA using a test bar with a diameter of 3 mm, assuming the thickness of the protective layer 7, which is glass, to be 0.5 mm, an object capacitance between the CAD 100 and the object 20 is formed, which ranges from 0.5 pF to 1 pF. The object capacitance (Cobj) formed on the upper side of the CDA 100 can be equivalently modeled as being connected at one end to the sensing CDA as in the embodiment of FIG. 1. Therefore, one side of the object capacitance (Cobj) is connected to the P-point, which is the equivalent circuit of the sensing signal line 210 connected to the sensing CDA, and the other side is equivalently connected to the voltage level (Vobj) of the object. If the object 20 is a human finger, the voltage Vobj of the object 20 is 0 V, which is the ground level, and in the case of a pen, it is the voltage output from the pen.

Figure 7:
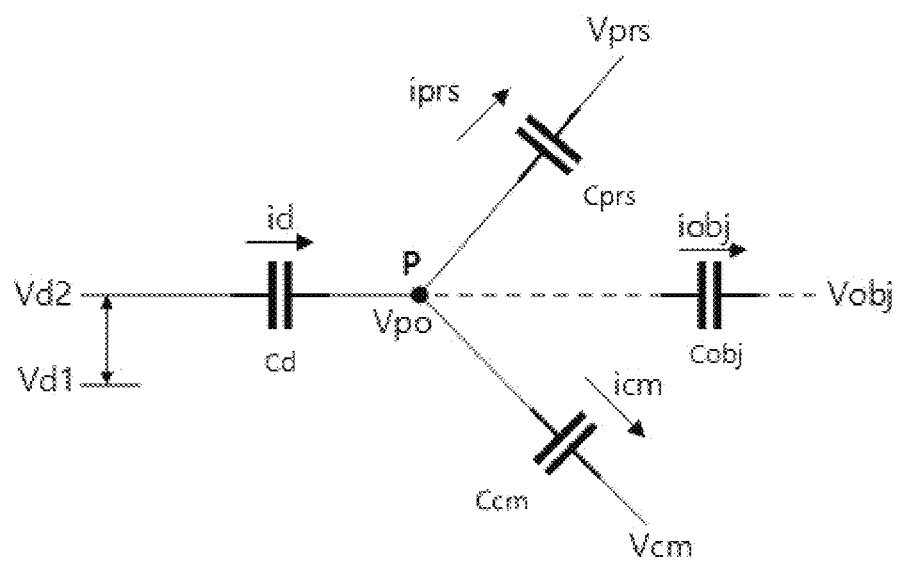
FIG. 7 is an embodiment of the invention concerning the modeling of the capacitive touch input device when an object capacitor is added.

FIG. 7 pertains to the modeling of the capacitive touch input device when the object capacitor is added, in accordance with an embodiment of the present invention. It has an added object capacitance (Cobj) compared to the embodiment in FIG. 1. The transfer function of the system with the added object capacitance (Cobj), denoted as [Equation 3], is determined as follows using the same method by which [Equation 1] was derived:

$$V_{po2} - V_{po1} = \frac{(Vd2 - Vd1) * Cd}{Cd + Cprs + Ccm + Cobj} \qquad \text{[Equation 3]}$$

Where:

When the voltage at point P stabilizes due to the application of driving voltage Vd1, it is denoted as Vpo1.

When the voltage at point P stabilizes due to the application of driving voltage Vd2, it is denoted as Vpo2.

The difference between the voltage at sensing CDA point P during non-touch, denoted by [Equation 1], and the voltage during touch, denoted by [Equation 3], lies in the object capacitance (Cobj) included in the denominator of [Equation 3]. The differences between [Equation 1] and [Equation 3] is determined solely due to the presence and magnitude of the object capacitance (Cobj). Detecting this difference can confirm the touch status caused by the object. Furthermore, by analyzing the magnitude of the object capacitance detected from multiple neighboring CDAs, it becomes possible to determine the touch coordinates caused by the object.

The mathematical expression to detect the magnitude of object capacitance (Cobj) is given by [Equation 4], defined as [Equation 1]-[Equation 3].

[Equation 1] − [Equation 3] = [Equation 4]

$$\frac{(Vd2 - Vd1) * Cd}{Cd + Cprs + Ccm} - \frac{(Vd2 - Vd1) * Cd}{Cd + Cprs + Ccm + Cobj}$$

[Equation 1] represents the voltage in the absence of an object. This is the standard voltage detected at each CDA and stored in memory when devices like smartphones or laptops are powered on, assuming no object is present. [Equation 3] represents the voltage detected by processing the CDA at predetermined sequences (e.g., every 10 ms at 100 Hz). A difference arises between Equations 1 and 3 when touch occurs. Real-time detected voltages per CDA are sent to the CPU or logic section, which analyzes the difference between Equations 1 and 3, determining both the touch status and the object's coordinates caused by the object.

The size of interline capacitance, composed of mutual capacitance or common electrode capacitance, directly correlates with the length of the CDA signal line. Since the length of the CDA signal line cannot be changed, it's not a consideration in this invention. Important variables in this invention relate to the CDA signal line width. It's explained below that even if the line width is reduced, there are no negative effects compared to the cited invention 1. Moreover, improvements resulting from the reduction of the sensing signal line width, driving signal line width, and thus the CDA signal line width are discussed further.

In an RC circuit, the Time Constant is the product of resistance and capacitance, and it signifies the time taken for the applied driving voltage to show 63.2% saturation across the resistance. After about five times the time constant, the initially applied voltage is mostly saturated. Ideally, detecting the signal from the resistance at this time would be optimal. However, considering the sequential selection of sensing CDAs from multiple column groups and the CDA columns included in each column group, the sensing time would be significantly prolonged. Therefore, in this invention, the signal is detected at about three times the time constant, which shows a saturation level of around 98% of the applied voltage. In other words, the time constant is determined by considering the line resistance of the sensing signal line and the combined capacitance value resulting from the interline capacitance, common electrode capacitance, and internal parasitic capacitance connected to the sensing signal line. After applying the driving voltage to the driving signal line, the voltage is detected on the sensing signal line 210 based on [Equation 1] or [Equation 3], three times the time constant later. For example, if the line resistance of the sensing signal line 210 is 100 kΩ and the interline capacitance is 30 pF, the time constant is 3 ms. Therefore, 9 ms after applying the driving voltage to the driving signal line, the detected voltage on the sensing signal line 210 is 98% of the driving voltage applied to the driving signal line 220, indicating it has nearly saturated.

The CDA signal line has a length "l" and a signal line width "d_sig". The area "s2" of the CDA signal line is determined by s2=d_sig*l. The resistance of the CDA signal line is given by the [Equation 2], $$R = \rho \frac{l}{d\_sig} (\Omega),$$

where ρ is the resistivity of the material. The capacitance of the common electrode, denoted as Ccm, is given by $$Ccm = \varepsilon \frac{S2}{d2} (F),$$

where d2 is the distance between the CDA signal line and the common electrode or conductor.

If we assume in FIG. 5A that the line width (d_sig) and the mutual line length (l) of the sensing signal line 202 and the driving signal lines 201 and 203 are the same, the capacitance resulting from the serial connection between Ccm201 and Ccm202 is $$\varepsilon \frac{S2}{2d2},$$

and similarly, the capacitance resulting from the serial connection between Ccm203 and Ccm202 is also $$\varepsilon \frac{S2}{2d2}.$$

As previously mentioned, for the interline capacitance, the magnitude due to the common electrode capacitance is a parallel connection of the series-connected capacitance between Ccm201 and Ccm202, and the series-connected capacitance between Ccm203 and Ccm202. Therefore, the magnitude in the interline capacitance due to the common electrode capacitance is, $$\varepsilon \frac{S2}{2d2} + \varepsilon \frac{S2}{2d2} = \varepsilon \frac{S2}{d2}.$$

Consequently, the first time constant, RC1, of the sensing signal line due to the series-connected common electrode capacitance in the interline capacitance is determined as shown in [Equation 5].

$$RC1 = \rho \frac{l}{d\_sig} * \varepsilon \frac{S2}{d2} = \rho \frac{l}{d\_sig} * \varepsilon \frac{d\_sig * l}{d2} = \rho \varepsilon \frac{l^2}{d2} \quad \text{[Equation 5]}$$

Examining the result of [Equation 5], which calculates the first time constant RC1 of the sensing signal line, we see that the signal line width (d_sig) is not included in the formula. Hence, there won't be any variation in the first time constant due to changes in the signal line width. This indicates an error in the example from Cited Invention 1, which aims to reduce the time constant magnitude by broadening the signal line width and thereby lowering line resistance. In other words, there is no need to widen the signal line width for improving detection speed.

The interline capacitance formed at the sensing signal line is a sum of the capacitances formed due to the common electrode between both driving and sensing signal lines and the mutual capacitance formed between them, denoted as Cd201 and Cd203.

In the equation determining the second time constant, RC2, influenced by mutual capacitance, both signal line width "d_sig" and the separation distance "d_line" act as variables (with the effects of the separation distance explained later). When referencing the equation regarding the mutual capacitance between two parallel plate conductors, it's known that a change in the "d_sig" width of the CDA signal line leads to about a 20~40% variation in the time constant, RC2. As an example, if the "d_sig" width of both the driving and sensing signal lines is expanded to "2d_sig", resulting in a 100% change, the mutual capacitance RC2 increases by 20~40%. These findings suggest that the embodiment of Cited Invention 1, which intends to decrease the time constant by broadening the signal line width, actually ends up raising the time constant, thereby causing further delays in signal detection.

The following is another issue due to the increased signal line width in the embodiment of Cited Invention 1. Referring to [Equation 1] or [Equation 3], the common electrode capacitance is located in the denominator of the equations. As in Cited Invention 1, where the signal line width increases for more distant locations, the common electrode capacitance grows larger for more distant CDAs. This leads to the issue where the detection sensitivity is reduced for more distant CDAs, even with the same object capacitance size. (Note that Cited Invention 1 used different object sizes for near and distant CDAs, making an error in not using the same size objects).

The time constants for Rows located near and far in the CDA column of the current invention differ. Hence, the saturation time for the sensing signal line due to the driving voltage varies for each Row. To minimize processing time, different processing times could be assigned for each Row. But considering the time for signals captured on the sensing signal line to be stored in the Sample & Hold and then discharged, it's more rational to allocate the same processing time for all Rows. (When processing a specific row, the voltage from the previous row is processed using the S&H circuit and the ADC. If the storage duration in the S&H circuit varies, discrepancies in the discharge time can introduce errors into the processed signal.) Assigning the longest time constant of the farthest CDA as the reference for all Rows would increase the overall processing time, slowing down touch response and increasing power consumption. Conversely, if the nearest CDA's time constant is used as the reference, detection errors may arise due to signal delays in far CDA. Thus, choosing a suitable Row position as the reference and setting the processing time based on its time constant is essential, but even then, there's still signal delay due to the time constant in the far CDA, necessitating the reduction of the time constant for better system performance.

Based on the review of the cited invention 1's embodiment which increases the signal line width as the distance increases, the following 5 problems were derived:
1) Object detection omission due to Dead Zone.
2) Touch coordinate calculation error due to Dead Zone.
3) As the distance increases, the common electrode capacitance and mutual capacitance of the sensing signal line also increase, leading to a discrepancy in signal detection between near and distant CDAs.
4. As the distance increases, the common electrode capacitance and mutual capacitance of the sensing signal line also increase, resulting in a decrease in sensitivity at distant CDAs.
5. Increase in processing time due to the increase of the second "time constant".

To address these issues, this invention narrows the CDA signal line width but lays it out in various ways as described later. According to the [Equation 5] representing the first time constant, even if the signal line width narrows, the signal detection speed in the far CDA is not affected. An embodiment of this invention lays out the far signal line as narrowly as possible based on [Equation 5]. By reducing the far CDA signal line width, the size of the common electrode capacitance decreases, thus improving the aforementioned issues 3) and 4). Also, if the CDA signal line width narrows, the size of the interline capacitance decreases and the second time constant becomes faster, thus improving the aforementioned issues 3) to 5). Furthermore, if the CDA signal line width narrows, the width of the SLH compared to the embodiment of the cited invention 1 narrows, meaning the Dead Zone narrows, thus improving issues 1) and 2).

Based on the analysis of the first- and second-time constants of the interline capacitance, it is desirable to narrow the signal line width as much as possible. The following methods can be applied for this:

CDA Signal Line Layout Method:
 1-1) In any CDA column, the far CDA signal line width is the same as the near CDA signal line width adjacent to it.
 1-2) In a CDA column, for a CDA group bundling multiple adjacent CDA signal lines, the width of the CDA signal line forming the CDA group is the same, and it is the same as the near CDA signal line width not included in the CDA group.
 1-3) All CDA signal lines in the CDA column have the same width.
 2) In a CDA column, for a CDA group bundling multiple adjacent CDA signal lines, the CDA signal line width within the same CDA group is the same, but they are laid out with different CDA signal line widths in other CDA groups.
 3) When the capacitance detection device of this invention is placed on the surface of the display device, the CDA signal line width, which faces the pixel, is formed narrower than the width of the sub-pixels that compose that pixel.
 4) When the capacitance detection device of this invention is placed on the surface of the display device, the CDA signal line width, which faces the pixel, is formed narrower than the width of the pixel.
 5) When the capacitance detection device of this invention is placed on the surface of the display device, the CDA signal line width facing the pixel is set based on the Sub Pixel Pitch (hereinafter referred to as SPP) of the pixel. As an example, the CDA signal line width may be placed as positive integer multiples of the SPP, such as 1SPP, 2SPP, 3SPP, or as positive real number multiples of the SPP, such as 0.5SPP, 1.5SPP, 2SPP, 2.5SPP, and so on.
 6) When the capacitance detection device of this invention is placed on the surface of the display device, the CDA signal line width facing the pixel is set based on the Pixel Pitch (hereinafter referred to as PP). As an example, the CDA signal line width may be placed as positive integer multiples of the PP, such as 1PP, 2PP, 3PP, or as positive real number multiples of the PP, such as 0.5PP, 1.5PP, 2PP, 2.5PP, and so on.

In the layout method 1-1), by having the condition that the far CDA signal line width in any CDA column is the same as the near CDA signal line width adjacent to it, the condition where the signal line width increases as the distance goes further as in the embodiment of the cited invention 1 is removed. Thus, it becomes a condition where the far signal line width can be the same as the near signal line width. In this specification, "far" should be understood as the furthest distance or the far section. Also, "far" is a relative distance concept compared to another signal line. For example, the CDA located in Row9 is farther than the CDA located in Row10.

While layout method 1-1) specifies the layout condition for two adjacent signal lines, layout method 1-2) specifies the layout condition for one signal line and one CDA group. For example, when Rows 1 to 10 are set as one CDA group, the signal line widths of Rows 1 to 10 that make up the CDA group mean that they are the same as the near CDA signal line width of Row 11 or Row 15, etc. For instance, when the signal line width of Row 11 is the same as the CDA group composed of Rows 1 to 10, it may be ambiguous whether Row 11 is included in the CDA group composed of Rows 1 to 10. Therefore, when a CDA group composed of multiple CDA signal lines has the same CDA signal line width, it can be considered to correspond to layout method 1-2).

The above layout method 1-3) means that all CDA signal lines included in the CDA column are laid out with the same signal line width. As observed in the first- and second-time constants, it is desirable to layout the signal line width under the condition with the narrowest signal line width, considering either the process conditions or conditions to avoid moiré effects. Based on the layout method of 1-3), all CDA signal lines of the capacitive detection device of the present invention formed by multiple column groups are composed of the same line width.

The above layout method 2) involves partitioning the CDA column into multiple CDA groups. Within a CDA group, the same signal line width is used, but it may differ from the signal line width used in other CDA groups. For example, in a CDA column composed of 25 CDAs, Rows 1 to 5 become CDA Group 1, and Rows 6 to 10 become CDA Group 2, and CDA Groups 3 and 4 are formed in the same way, with the last Rows 21 to 25 forming CDA Group 5. At this time, since CDA Group 1 is located at the farthest distance, the Row1 CDA signal line fully connects the longitudinal starting point and endpoint of the capacitance detection device of this invention with the signal line. When the capacitive detection device of the present invention transmits and receives the necessary information with the pen, CDA Group 1 can be used as a transmitting antenna. At this time, the CDA signal lines of Rows 1 to 5 of CDA Group 1 must be composed of a certain line width to provide an appropriate area required by the facing pen.

Also, the CDA signal lines of Rows 6 to 10 belonging to CDA Group 2 serve as antennas for receiving signals from the pen, and are composed of a certain CDA signal line width suitable for antenna engineering, and may have a different signal line width from the CDA line width of CDA Group 1 or CDA signal lines belonging to another CDA group. CDA Groups 3 to 5 can be laid out with different signal line widths depending on the product's characteristics or all can be composed of the same width.

Figure 8:
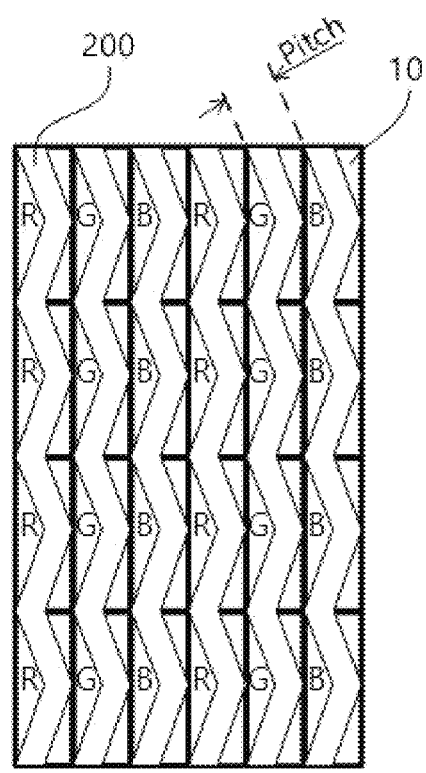
FIG. 8 is an embodiment of the invention detailing the layout of the CDA signal line installed on the upper side of the pixel of the display device.

Next, layout method 3) will be described with reference to FIG. 8 as an embodiment. FIG. 8 is an embodiment of the present invention regarding the layout of the CDA signal line placed on the upper side of the pixels that constitute the display device. The display device is based on the LCD, but the same approach is also applied to the OLED display device.

The display device 10 is an RGB Stripe structure LCD, and the figure shows a part of the SLH that constitutes an arbitrary CDA column of the capacitance detection device placed on the upper side of the display device. The display device is composed of a set of pixels consisting of three sub-pixels, Red/Green/Blue. Between Sub Pixels, the BM (Black Matrix) due to the Gate signal line is arranged horizontally, and the BM due to the Source signal line is arranged vertically, which is installed on the corresponding Color Filter. In FIG. 8, it is represented by a thick line between Sub Pixels. Among the many CDA signal lines that make up the SHL, six of the CDA signal lines 200 are laid out from a distant position to a closer position (based on the semiconductor IC that is not shown in the figure).

The CDA signal line 200 is arranged in a zigzag shape diagonally to avoid the moiré phenomenon with the sub-pixel and maintains a certain facing area occupancy rate with the CDA signal line and the sub-pixel, but has a unique facing area occupancy rate for each R/G/B sub-pixel. For example, the facing area of the CDA signal line arranged on the Red sub-pixel surface and the Red sub-pixel is all 55%. Also, it's 45% for the Green Sub Pixel and 65% for the Blue Sub Pixel. Therefore, although the facing area of the Red/Green/Blue sub-pixel and the CDA signal line is shown to be the same in the embodiment of FIG. 8, it can actually vary by sub-pixel.

If the display device is of low resolution, such as XGA or HD, and the pitch of the sub-pixel is large due to this, one or more CDA signal lines can be positioned adjacent to or facing the sub-pixel. For example, when the pitch of the pixel is 210 um(H)×210 um(V) and the pitch of the sub-pixel is 70 um(H)×210 um(V), if one CDA signal line is positioned for each sub-pixel, 25 CDA signal lines are required to be laid out for one CDA column, and therefore, 25 sub-pixels are required, so the width of the widest part of the SLH is 1.75 mm. If the CDA is square and its area is assumed to be 4 mm×4 mm, the horizontal side of the 4 mm shrinks to 2.25 mm, resulting in a loss of about 44% of the sensing area. To solve this problem, the present invention positions two or more CDA signal lines facing one sub-pixel. If two CDA signal lines are positioned within one sub-pixel, 12.5 sub-pixels are needed to arrange 25 CDA signal lines, and at this time, the width of the widest part of SLH is 0.875 mm, which is reduced by half compared to 1.75 mm.

As such, the present invention requires one or more CDA signal lines to be positioned facing the sub-pixel when the display device is of low resolution, so the CDA signal line width must be smaller than the pitch of the sub-pixel.

Next, we'll describe layout method 4). In high-end display devices with high resolutions like 400PPI (Pixel Per Inch) or 500PPI, the pitch of the sub-pixels can be less than 20 um. If the manufacturing capability for the CDA signal line exceeds 20 um (considering yield), as in the case of layout example 3), it's impossible to place one CDA signal line corresponding to each sub-pixel. In this case, the layout needs to have one CDA signal line corresponding to two sub-pixels or one CDA signal line corresponding to a pixel comprising three sub-pixels. Layout method 4) is relevant when the display device has high resolution and the width of the CDA signal line isn't larger than a pixel.

Next, we'll describe layout method 5). Some display devices may have different pitches for Red, Green, and Blue sub-pixels, especially with the Blue sub-pixel often having a smaller pitch. To avoid moiré, the width or pitch of the CDA signal line placed for each sub-pixel may vary. For example, in the case of a low-resolution display device, the width of the CDA signal line or the signal line pitch can be 0.6SPP (Sub Pixel Pitch) for the Red Sub Pixel, 0.7SPP for the Green Sub Pixel, and 0.8SPP for the Blue, among other methods that can be used. In high-resolution devices, the Red may have 1.2SPP, Green 1.3SPP, and Blue 1.45SPP. The multiples can vary for each sub-pixel, be the same for any two sub-pixels, or be identical across all sub-pixels. The multiplier can be a positive integer or a real number. Just like in layout method 2), different CDA groups can have different multipliers. For instance, some CDA groups might have a multiplier of 1, and neighboring CDA groups might have multipliers of 2 or 1.2.

Next, the explanation for layout method 6). In high-resolution display devices where the sub-pixel pitch is small and the processing capability for the CDA signal line doesn't match the combined pitch of the sub-pixels, the width of the CDA signal line should be determined as a multiple of the pixel. The pixel pitch (PP) includes the visible area of the pixel and the width with the BM. For instance, 2PP signifies that the width of the CDA signal line is twice the pixel pitch. As in layout method 2), different CDA groups can have different multipliers. Some CDA groups might have a multiplier of 1, while neighboring ones could have 2 or 1.2.

The aforementioned layout methods 1-1) to 6) can be used alone or in combination. For example, methods 2) and 3) can be used together, or methods 1-2), 2), and 3) can be combined. In another embodiment, for the 25 CDAs that make up one CDA column, with 12 CDAs in the near section and 13 CDAs in the far section, method 1-1) can be applied to the near section, and method 1-2) can be applied to the far section. It is possible to layout the width of the entire or part of the CDA signal line more narrowly using various combinations.

Next is the discussion about the space between CDA signal lines. As previously mentioned, when the sensing signal line and driving signal line face each other with a gap, interline capacitance forms. The separation distance (d_line) between these two signal lines influences the magnitude of this capacitance. When the separation distance reduces by 100%, the interline capacitance typically increases by about 20%~30%.

The sum of the CDA signal line width (d_sig) and the separation distance (d_line) is referred to as the pitch of the CDA signal line, as shown in FIGS. 5A and 8. Since the width of the SLH is determined by the sum of multiple signal line widths and separation distances, narrowing the separation distance reduces the dead zone's width. Even if the separation distance is minimized, the influence on the interline capacitance isn't significant, so to minimize the dead zone, the separation distance is set in relation to the CDA signal line width.

The most desirable method is to keep the CDA signal line width and the separation distance the same. When the gap between CDA signal lines is the same as the CDA signal line width placed on the sub-pixel surface (as in the example in FIG. 8) and has the same shape as the CDA signal line, moiré generated from light refraction or interference occurs regularly from both the CDA signal line and the separation space. By adjusting the CDA signal line's diagonal angle or its facing area with the sub-pixel, it's possible to eliminate moiré across the entire display device using one recipe. However, if the CDA signal line width and the separation distance differ, moiré caused by the CDA signal line and separation space can occur separately, making it impossible to eliminate moiré with a single recipe. Multiple recipes would be needed to avoid moiré.

To minimize the width of the Dead Zone caused by SLH, the separation distance can be made narrower than the width of the CDA signal line, and this method can be applied to the CDA signal lines located in the near distance. Since the length of the CDA signal line located in the near distance is short, the value of the interline capacitance and the value of the common electrode capacitance are smaller compared to the CDA signal line in the far distance. Therefore, even if the time constant increases due to the reduction in separation distance, it remains lower than the time constant of the CDA located in the far distance, so it does not affect the stability of the detected signal or the operation of the system. As such, the present invention makes it possible to minimize the area of the Dead Zone by narrowing the separation distance of the CDA signal line located in the near distance to be narrower than the width of the CDA signal line.

The aforementioned layout methods 1-1) to 6) for the CDA signal line were described based on the width of the CDA signal line, but the term "CDA signal line width" can be replaced with "CDA signal line Pitch". In other words, the CDA signal line width can be substituted with the CDA signal line width and separation distance. Accordingly, it becomes possible to clearly understand the configuration of SLH, which consists of the CDA signal line width and the separation distance, which is the CDA signal line Pitch, in this specification. For example, in the embodiment of layout method 3), "the CDA signal line width being smaller than the Sub Pixel" can be replaced with "the CDA signal line Pitch being smaller than the Sub Pixel".

According to one embodiment of the present invention, the size of the common electrode capacitance of the CDA signal line at far distances decreases, improving touch sensitivity. This results in minimizing the voltage difference detected by the object capacitance of the same area in both near and far-distance CDA. Additionally, the time constant of the CDA signal line at far distances is reduced, enhancing touch detection speed and reducing power consumption. Furthermore, as the width of the Dead Zone narrows, it becomes possible to detect touches from objects with small touch areas, such as pens, or from delicate finger touches. This also leads to an improvement in the accuracy of touch coordinates. The effects of the present invention are not limited to the aforementioned benefits and should be understood to include all effects inferred from the detailed description or the features stated in the claims.

The description of the present invention as described above is for illustrative purposes, and those skilled in the technical field to which the present invention pertains will understand that the present invention can be easily modified into other specific forms without changing the technical idea or essential features of the present invention. Therefore, the embodiments described above should be understood as illustrative in all respects and not as limiting. For instance, individual elements described as singular can be combined to form a comprehensive device, and similarly, a comprehensive device can be implemented in the form of combined individual elements not described. The scope of the present invention is defined by the claims set, and all changes or modifications derived from the meaning and scope of the claims and their equivalents should be interpreted as being included within the scope of the present invention."

DETAILED DESCRIPTION OF MAIN ELEMENTS

3: Common electrode or conductor
4: Color Layer
5: Color Filter Glass
7: Protective layer
10: Display device
20: Object
100: CDA (Capacitor Detection Area)
200: CDA signal line
201: Far CDA signal line
202: Mid CDA signal line
203: Near CDA signal line
210: Sensing signal line
220: Driving signal line
300: Material for connection
301: Attached part
302: Connection part
400: Semiconductor IC
410: Signal processing unit
420: Driving part
430: Multiplexer for selecting sensing signal line
440: Multiplexer for selecting driving signal line
461: Substrate
462: Insulator
463: First signal layer
464: Second signal layer
465: Third signal layer
466: Passivation

What is claimed is:

1. A capacitive detection device comprising:
a Capacitor Detection Area (CDA) positioned on an upper side of a conductor including a common electrode of a display device and connected at one side to one side of a CDA signal line, the CDA signal line being made of a transparent conductive material, wherein other side of the CDA is not connected to other CDA signal line,
a plurality of CDA signal lines connected to each of the plurality of CDAs forming a CDA column, disposed on the same layer as the CDA column, wherein the plurality of CDA signal lines is electrically isolated from each other, forming a bundle of the CDA signal lines, and arranged in one direction at one side of the CDA column;
a semiconductor IC, operating asynchronously with a video signal, controlling an operation of the capacitive detection device to detect touch signals from the plurality of CDAs;
the CDA column, based on the semiconductor IC, wherein the quantity of the plurality of CDA signal lines increases proportionally as the number of the plurality of CDAs increases from a far distance to a near distance, and an area of the plurality of CDAs constituting the CDA column gradually decreases as the number of the plurality of CDAs increases from far to near; and
a CDA group composed of the neighboring plurality of CDAs within the CDA column and the plurality of CDA signal lines connected to each of the plurality of CDAs,
wherein, width of the plurality of CDA signal lines constituting the CDA group is identical, and when an nth CDA signal line in the CDA column is selected as a sensing signal line, (n−1) or (n+1) or both (n−1) and (n+1) CDA signal lines in the CDA column are selected as a driving signal line, and a driving voltage is applied to the selected driving signal line to detect an object capacitance added to a sensing CDA connected to the sensing signal line,
wherein the conductor is a common electrode of an LCD display device or a cathode of an OLED display device,
wherein the plurality of CDA signal lines is positioned on the upper side of pixels forming the display device,
wherein the width of the CDA signal line or a combined value of its width and the distance between adjacent CDA signal line, which defines the pitch of the CDA signal line, is determined as m1 times Sub Pixel Pitch (SPP), wherein m1 is a positive integer or a positive real number,
wherein the plurality of CDA signal lines is laid out diagonally in a zigzag shape based on the shape of subpixels that face the CDA signal lines on an upper or lower side.

2. The capacitive detection device of claim 1, wherein:
when no object capacitance is added to the sensing CDA connected to the nth sensing signal line, the voltage detected from the nth sensing signal line is determined by the following [Equation 1], and the voltage detected from the nth sensing signal line due to an object capacitance Cobj added to the sensing CDA connected to the nth sensing signal line is determined by the following [Equation 2], wherein the object capacitance is detected based on the result of [Equation 1]-[Equation 2], $$Vp2 - Vp1 = \frac{(Vd2 - Vd1) * Cd}{Cd + Cprs + Ccm} \quad \text{[Equation 1]}$$

$$Vp2 - Vp1 = \frac{(Vd2 - Vd1) * Cd}{Cd + Cprs + Ccm + Cobj} \quad \text{[Equation 2]}$$

wherein:
a) Cd is an interline capacitance formed between the sensing CDA and the driving CDA,
b) Ccm is a common electrode capacitance formed when the sensing CDA and the conductor are facing each other,
c) Cprs is a parasitic capacitance formed on a sensing CDA signal line within the semiconductor IC,
d) Vp1 is the voltage detected at the sensing CDA when a driving voltage Vd1 is applied to the driving CDA,
e) Vp2 is the voltage detected at the sensing CDA when a driving voltage Vd2 is applied to the driving CDA.

3. The capacitive detection device of claim 2, wherein the value of [Equation 1] is stored in memory and is recalled from memory to be compared with a real-time detection value of [Equation 2].

4. The capacitive detection device of claim 1, wherein: in the CDA column, the length of the plurality of CDA signal lines connected to the CDA located far from the semiconductor IC is longer than that connected to the CDA located nearer to the semiconductor IC.

5. The capacitive detection device of claim 1, wherein:
a second common electrode capacitance is formed between the sensing signal line and the conductor;
a first common electrode capacitance is formed between an (n−1)th driving signal line and the conductor;
a third common electrode capacitance is formed between an (n+1)th driving signal line and the conductor;
when the driving voltage is applied to the (n−1)th driving signal line, the first and second common electrode capacitances connect in series to a fourth common electrode capacitance, the fourth common electrode capacitance supplies charge to the sensing signal line; and
when the driving voltage is applied to the (n+1)th driving signal line, the third and second common electrode capacitances connect in series to a fifth common electrode capacitance, the fifth common electrode capacitance supplies charge to the sensing signal line.

6. The capacitive detection device of claim 5, wherein:
the (n−1)th driving signal line and the (n+1)th driving signal line are commonly connected to a driving part of the semiconductor IC, and when the driving voltage provided by the driving part is applied to both the (n−1)th driving signal line and the (n+1)th driving signal line, the first time constant of the sensing signal line is determined by the following [Equation 3], $$RC1 = \rho \varepsilon \frac{l^2}{d2} \quad \text{[Equation 3]}$$

wherein,
a) R is a resistance of the sensing signal line,
b) C1 is a capacitance value formed on the sensing signal line due to a parallel connection of the fourth and fifth common electrode capacitances,
c) ρ is the resistivity of the conductor forming the sensing signal line and the driving signal line,
d) ε is a dielectric constant of an insulator positioned between the sensing/driving signal lines and the facing conductor,
e) d2 is a separation distance between the sensing/driving signal lines and the facing conductor, and
f) l is the length of the sensing and driving signal lines facing the conductor, assumed to be of equal length.

7. The capacitive detection device of claim 1, wherein:
a second time constant RC2 due to a mutual capacitance formed between the sensing signal line and the driving signal line varies by an identical increase or decrease of 20% to 40% in response to variations in the increase or decrease of the signal line width d_sig of the sensing signal line and the driving signal line, wherein R represents the value of a line resistance of the sensing signal line, and C2 represents the value of a mutual capacitance formed between the sensing signal line and the driving signal line.

8. The capacitive detection device of claim 1, wherein:
all the plurality of CDA signal lines widths of the plurality of CDA groups forming the CDA column are identical.

9. The capacitive detection device of claim 1, wherein:
within the CDA column, the width of the plurality of CDA signal lines for a certain CDA group is identical to the width of a nearby CDA signal line that does not belong to the certain CDA group.

10. The capacitive detection device of claim 1, wherein:
the plurality of CDA signal lines width of the plurality of CDA groups constituting the CDA column is characterized by being different for each of the plurality of CDA groups.

11. The capacitive detection device of claim 1, wherein:
for sub pixels composing the pixel, the value of ml is different for each sub pixel.

12. The capacitive detection device of claim 1, wherein:
the value of the mutual capacitance formed between the sensing signal line and the driving signal line increases by a ratio of 20% to 30% when the separation distance between the sensing signal line and the driving signal line is reduced by a ratio of 100%.

13. The capacitive detection device of claim 1, wherein:
the magnitude of the mutual capacitance formed between the sensing signal line and the driving signal line is proportional to the length "1" of the driving signal line and the length "1" of the sensing signal.

14. The capacitive detection device of claim 1, wherein:
a CDA column group consisting of the plurality of CDA columns, and the semiconductor IC selects all CDAs from an arbitrary nth row as the sensing CDA to perform processing for detecting the object capacitance, Subsequently, the semiconductor IC selects all CDAs from the (n+1)th row as the sensing CDA for the next round of capacitive detection processing.

15. The capacitive detection device of claim 14, wherein:
all CDAs of the row where the processing to detect the object capacitance is conducted start processing simultaneously.

16. The capacitive detection device of claim 14, wherein:
for the plurality of multiple CDA column groups, processing commences in another CDA column group after the processing in one CDA column group concludes.

17. The capacitive detection device of claim 14, wherein:
after the processing concludes, the detected voltages from each of the sensing CDA are individually stored in an analog storage device.

18. The capacitive detection device of claim 17, wherein:
the analog storage device is characterized as a Sample & Holder.

19. The capacitive detection device of claim 17, wherein:
the plurality of voltages stored in the analog storage device from the sensing CDA are sequentially selected using a multiplexer and then digitized using an ADC.

20. The capacitive detection device of claim 1, wherein:
each CDA column is equipped with a multiplexer for selecting a sensing signal line, and the multiplexer selects one sensing signal line from the CDA column.

21. The capacitive detection device of claim 1, wherein:
each CDA column is equipped with a multiplexer for selecting a driving signal line, and the multiplexer selects one or multiple driving signal lines from the CDA column.

22. A capacitive detection device comprising:
a Capacitor Detection Area (CDA) positioned on an upper side of a conductor including a common electrode of a display device and connected at one side to one side of a CDA signal line, the CDA signal line being made of a transparent conductive material, wherein other side of the CDA is not connected to other CDA signal line,
a plurality of CDA signal lines connected to each of the plurality of CDAs forming a CDA column, disposed on the same layer as the CDA column, wherein the plurality of CDA signal lines are electrically isolated from each other, forming a bundle of the CDA signal lines, and arranged in one direction at one side of the CDA column;
a semiconductor IC, operating asynchronously with a video signal, controlling an operation of the capacitive detection device to detect touch signals from the plurality of CDAs;
the CDA column, based on the semiconductor IC, wherein the quantity of the plurality of CDA signal lines increases proportionally as the number of the plurality of CDAs increases from a far distance to a near distance, and an area of the plurality of CDAs constituting the CDA column gradually decreases as the number of the plurality of CDAs increases from far to near; and
a CDA group composed of the neighboring plurality of CDAs within the CDA column and the plurality of CDA signal lines connected to each of the plurality of CDAs,
wherein, width of the plurality of CDA signal lines constituting the CDA group is identical, and when an nth CDA signal line in the CDA column is selected as a sensing signal line, (n−1) or (n+1) or both (n−1) and (n+1) CDA signal lines in the CDA column are selected as a driving signal line, and a driving voltage is applied to the selected driving signal line to detect an object capacitance added to a sensing CDA connected to the sensing signal line,
wherein the conductor is a common electrode of an LCD display device or a cathode of an OLED display device,
wherein the plurality of CDA signal lines is positioned on the upper side of pixels forming the display device,
wherein width of the CDA signal line or the combined value of its width and the distance between adjacent CDA signal line, which defines the pitch of the CDA signal line, is determined as n times the pixel pitch (PP), wherein n is a positive integer or a positive real number,
wherein the plurality of CDA signal lines is laid out diagonally in a zigzag shape based on the shape of subpixels that face the CDA signal lines on an upper or lower side.

23. A capacitive detection device comprising:
a Capacitor Detection Area (CDA) positioned on an upper side of a conductor including a common electrode of a display device and connected at one side to one side of a CDA signal line, the CDA signal line being made of a transparent conductive material, wherein other side of the CDA is not connected to other CDA signal line,
a plurality of CDA signal lines connected to each of the plurality of CDAs forming a CDA column, disposed on the same layer as the CDA column, wherein the plurality of CDA signal lines are electrically isolated from each other, forming a bundle of the CDA signal lines, and arranged in one direction at one side of the CDA column;
a semiconductor IC, operating asynchronously with a video signal, controlling an operation of the capacitive detection device to detect touch signals from the plurality of CDAs;
the CDA column, based on the semiconductor IC, wherein the quantity of the plurality of CDA signal lines increases proportionally as the number of the plurality of CDAs increases from a far distance to a near distance, and an area of the plurality of CDAs constituting the CDA column gradually decreases as the number of the plurality of CDAs increases from far to near; and
a CDA group composed of the neighboring plurality of CDAs within the CDA column and the plurality of CDA signal lines connected to each of the plurality of CDAs,
wherein, width of the plurality of CDA signal lines constituting the CDA group is identical, and when an nth CDA signal line in the CDA column is selected as a sensing signal line, (n−1) or (n+1) or both (n−1) and (n+1) CDA signal lines in the CDA column are selected as a driving signal line, and a driving voltage is applied to the selected driving signal line to detect an object capacitance added to a sensing CDA connected to the sensing signal line,
wherein the conductor is a common electrode of an LCD display device or a cathode of an OLED display device,
wherein the plurality of CDA signal lines is positioned on the upper side of pixels forming the display device,
wherein the width of the CDA signal line, or the combined value of its width and the distance between adjacent CDA signal line, which defines the pitch of the CDA signal line, is determined based on m2 times twice Sub Pixel Pitch (SPP), wherein twice the SPP represents the pitch of two adjacent sub pixels, wherein m2 is a positive integer or a positive real number,
wherein the plurality of CDA signal lines is laid out diagonally in a zigzag shape based on the shape of subpixels that face the CDA signal lines on an upper or lower side.

* * * * *